(12) United States Patent
Kawai et al.

(10) Patent No.: US 8,497,188 B2
(45) Date of Patent: Jul. 30, 2013

(54) METHOD FOR PRODUCING BONDED WAFER

(75) Inventors: Makoto Kawai, Annaka (JP); Yuji Tobisaka, Annaka (JP); Shoji Akiyama, Annaka (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 0 days.

(21) Appl. No.: 13/318,250

(22) PCT Filed: Apr. 30, 2010

(86) PCT No.: PCT/JP2010/057650
§ 371 (c)(1),
(2), (4) Date: Oct. 31, 2011

(87) PCT Pub. No.: WO2010/126122
PCT Pub. Date: Nov. 4, 2010

(65) Prior Publication Data
US 2012/0058622 A1 Mar. 8, 2012

(30) Foreign Application Priority Data
May 1, 2009 (JP) .................................. 2009-111865

(51) Int. Cl.
*H01L 21/30* (2006.01)
(52) U.S. Cl.
USPC ..... 438/458; 438/445; 438/459; 438/E21.211
(58) Field of Classification Search
USPC ................... 438/426, 458–460, 480
See application file for complete search history.

(56) References Cited

U.S. PATENT DOCUMENTS
6,284,628 B1 9/2001 Kawahara et al.
(Continued)

FOREIGN PATENT DOCUMENTS
EP 1 482 548 A1 12/2004
EP 1 970 942 A1 9/2008
(Continued)

OTHER PUBLICATIONS

European Patent Office, Supplementary European Search Report on Corresponding Application No. EP 10 76 9820, Dated Nov. 23, 2012.

*Primary Examiner* — Dung A. Le
(74) *Attorney, Agent, or Firm* — Roberts Mlotkowski Safran & Cole, P.C.; David S. Safran

(57) ABSTRACT

When a thermal expansion coefficient of a handle substrate is higher than that of a donor substrate, delamination is provided without causing a crack in the substrates. A method for producing a bonded wafer, with at least the steps of: implanting ions into a donor substrate (3) from a surface thereof to form an ion-implanted interface (5); bonding a handle substrate (7) with a thermal expansion coefficient higher than that of the donor substrate (3) onto the ion-implanted surface of the donor substrate to provide bonded substrates, subjecting the bonded substrates to a heat treatment to provide an assembly (1), and delaminating the donor substrate (3) of the assembly (1) at the ion-implanted interface wherein the assembly (1) has been cooled to a temperature not greater than room temperature by a cooling apparatus (20), so that a donor film is transferred onto the handle substrate (7).

6 Claims, 1 Drawing Sheet

U.S. PATENT DOCUMENTS

| | | |
|---|---|---|
| 6,951,796 B2 | 10/2005 | Sakaguchi |
| 7,176,528 B2 | 2/2007 | Couillard et al. |
| 8,053,331 B2 * | 11/2011 | Gadkaree ............... 438/458 |
| 2008/0124929 A1 * | 5/2008 | Okuda et al. ............ 438/692 |
| 2009/0233079 A1 * | 9/2009 | Bedell et al. ............ 428/310.5 |
| 2010/0127343 A1 * | 5/2010 | Daigler et al. ........... 257/507 |
| 2011/0156212 A1 * | 6/2011 | Arena ...................... 257/615 |

FOREIGN PATENT DOCUMENTS

| | | |
|---|---|---|
| EP | 1 981 063 A1 | 10/2008 |
| JP | 11-307413 A | 11/1999 |
| JP | 2004-103602 A | 4/2004 |
| JP | 2006-518116 A | 8/2006 |
| JP | 2008-114448 A | 5/2008 |

* cited by examiner

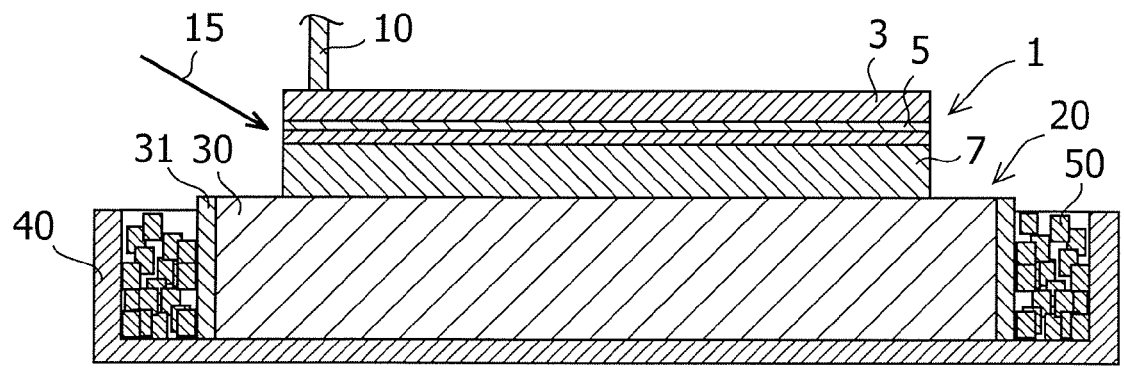

METHOD FOR PRODUCING BONDED WAFER

BACKGROUND OF THE INVENTION

1. Field of the Invention

The present invention relates to a method for producing a bonded wafer.

2. Description of Related Art

Conventionally, silicon-on-insulator (SOI) which has a handle substrate formed of a transparent insulating substrate and which includes silicon-on-quartz (SOQ), silicon-on-glass (SOG) and silicon-on-sapphire (SOS), and bonded wafers (in this case, a semiconductor substrate is transparent) provided by combining a transparent wide-gap semiconductor made of GaN, ZnO, diamond, AlN, etc., with a donor substrate made of silicon, have been proposed, and have been expected to find various applications. The SOQ, the SOG, and the SOS are expected to find use in projectors, radio frequency devices, etc., for their insulating properties and transparency. Furthermore, bonded wafers, in which a film of a wide-gap semiconductor is combined with a handle substrate, use only a very little expensive wide-gap semiconductor material corresponding to a thickness of some hundred nanometers to some micrometers, so that significant cost reduction may be achieved. Thus, they are expected to find use in high-performance lasers, power devices, etc.

Conventional SOI producing techniques based on bonding are broadly classified into two processes. One is the SOITEC process in which a silicon substrate (donor substrate) pre-implanted with hydrogen ions at room temperature and a substrate (handle substrate) to be used as a support substrate are bonded to each other, are subjected to a heat treatment at a high temperature (near 500° C.) to generate a number of microbubbles called microcavities at the ion-implanted interface, and are delaminated at the interface so that a silicon film is transferred onto the handle substrate.

The other is a process called the SiGen process in which a silicon substrate also pre-implanted with hydrogen ions and a handle substrate are bonded to each other after the surfaces of both substrates are activated with a plasma treatment, and then the substrates are mechanically delaminated from each other at the hydrogen ion-implanted interface.

However, since different types of substrates are bonded for the combination of the materials mentioned above, the thermal expansion coefficient of a semiconductor substrate does not match the thermal expansion coefficient of a donor substrate. The SOITEC process has the drawback in that one or more substrates crack due to a large difference in thermal expansion coefficient when different types of substrates as described above are bonded, because a heat treatment at a high temperature (about 500° C.) for heat delamination at a hydrogen ion-implanted interface is conducted after bonding. Compared with the SOITEC process, the SiGen process provides a high bonding strength at the time when the substrates are bonded with a surface activation treatment, and can provide a higher bonding strength with a heat treatment at a relatively low temperature at about 250° C. to 350° C. However, during the progress of the experiments in which the invention was made, it was found that when the substrates bonded at room temperature are heated to this temperature range, either or both of the substrates are subjected to breakage or formation of an untransferred portion, due to difference in thermal expansion coefficient between the two substrates. On the other hand, for the ion-implanted interface to be embrittled, a proper heat treatment is required, so that avoiding a heat treatment at temperature between 150° C. to 350° C. is undesirable.

As a result, the problems may occur that a substrate or substrate are subjected to breakage due to difference in thermal expansion coefficient between the bonded substrates, an untransferred portion is formed in a silicon film to be transferred, etc. This is because temperature rise increases a bonding strength at a bonding interface, but it also causes detachment induced by warpage resulting from different types of substrates being bonded, so that in-plane bonding does not progress uniformly. When the substrates are bonded, and then subjected to a high temperature treatment as they are, the problem of crack formation in the substrate, or the problem of detachment of the bonded substrates arises.

Thus, there is the disadvantage that adopting a high temperature process (at about 500° C.) for heat delamination at a hydrogen ion-implanted interface after bonding is difficult because of difference in thermal expansion coefficient between a semiconductor substrate and a handle substrate, so that conventional processes typified by the SOITEC process are difficult to be adapted thereto.

For example, if a donor substrate and a handle substrate used for the bonding above are respectively a silicon substrate and a quartz substrate, established is the following relationship: the thermal expansion coefficient of the donor substrate>the thermal expansion coefficient of the handle substrate. It was experimentally found that for a composite substrate which satisfies the relationship above, delamination starts from the ion-implanted interface so that a silicon film is successfully transferred with the SiGen process, etc., described above due to the way that internal stress is produced and a silicon substrate breakage mechanism.

However, the handle substrate is made of a material such as aluminum oxide, aluminum nitride, silicon carbide, silicon nitride, sialon, gallium nitride, etc., established is the following relationship: the thermal expansion coefficient of the donor substrate<the thermal expansion coefficient of the handle substrate. The inventors' experimentation has found that in this case, there arises the problem that a phenomenon occurs in which delamination does not start from the ion-implanted interface and either or both of the handle substrate and the donor substrate cracks.

An example of the prior art can be found in Japanese Patent Publication JP 2008-114448 A.

SUMMARY OF INVENTION

In view of the aforementioned circumstances, it is an object of the present invention to provide a method for producing a bonded wafer in which when delamination is conducted at an ion-implanted interface, in particular when a handle substrate has a higher thermal expansion coefficient (i.e., a donor substrate has a lower thermal expansion coefficient), the substrates are delaminated from each other without any crack being formed in the substrates.

Solution to Problem

The present invention intends to solve the aforementioned problems. More specifically, a method for producing a bonded wafer of the present invention comprises at least the steps of: implanting ions into a donor substrate from a surface of the donor substrate to form an ion-implanted interface; bonding a handle substrate with a thermal expansion coefficient higher than that of the donor substrate onto the ion-implanted surface of the donor substrate subjected to ion implantation to provide bonded substrates, subjecting the bonded substrates to a heat treatment to obtain an assembly, and delaminating the donor substrate of the assembly at the ion-implanted interface wherein the assembly has been cooled to temperature not greater than room temperature by a cooling apparatus, so that a donor film is transferred onto the handle substrate.

Advantageous Effects of Invention

According to the method for producing a bonded wafer of the present invention, delamination can be conducted without any crack being formed in a substrate when the thermal expansion coefficient of a handle substrate is greater than that of a donor substrate.

BRIEF DESCRIPTION OF DRAWINGS

The sole FIGURE is a diagrammatic cross-sectional view showing a relationship among a cooling apparatus, an air-blown portion of bonded substrates, and a means for holding a delaminated substrate by suction.

DETAILED DESCRIPTION OF THE INVENTION

A material of a donor substrate to which the method for producing a bonded wafer of the present invention is applied is preferably silicon. The thickness of the donor substrate is not particularly limited, but a typical thickness close to that specified by SEMI/JEIDA standards is easily manageable from the handling point of view. A material of a handle substrate preferably has a thermal expansion coefficient less than that of the donor substrate, and is preferably one selected from aluminum oxide, aluminum nitride, silicon carbide, silicon nitride, sialon, and gallium nitride. In the present invention, the thickness of the handle substrate is not particularly limited, but a typical thickness close to that specified by SEMI/JEIDA standards is easily manageable from the handling point of view.

First, ions are implanted into a donor substrate or a donor substrate with an oxide film (hereinafter simply referred to as a "donor substrate", if not specified) to form an ion-implanted layer 5. The ion-implanted layer is formed in the donor substrate. At this time, hydrogen ions ($H^+$) or hydrogen molecule ions ($H_2^+$) having a predetermined dose amount are implanted from a surface thereof with an implantation energy which allows for formation of the ion-implanted layer at a desired depth. A condition at this time may be, for example, that the implantation energy being 50 keV to 100 keV. The ion implantation depth is determined according to a thickness of a desired donor film, and may be typically 50 nm to 2,000 nm.

A dose amount of hydrogen ions ($H^+$) to be implanted to the donor substrate is preferably from $1.0 \times 10^{16}$ atoms/cm$^2$ to $1.0 \times 10^{17}$ atoms/cm$^2$. When the dose amount is less than $1.0 \times 10^{16}$ atoms/cm$^2$, the interface may not be embrittled, whereas when the dose amount exceeds $1.0 \times 10^{17}$ atoms/cm$^2$, air bubbles may be formed during a heat treatment after bonding, which may cause poor transfer. When hydrogen molecule ions ($H_2^+$) are used as implantation ions, the dose amount is preferably from $5.0 \times 10^{15}$ atoms/cm$^2$ to $5.0 \times 10^{16}$ atoms/cm$^2$. When the dose amount is less than $5.0 \times 10^{15}$ atoms/cm$^2$, the interface may not be embrittled, whereas when the dose amount exceeds $5.0 \times 10^{16}$ atoms/cm$^2$, air bubbles may be formed during a heat treatment after bonding, which may cause poor transfer. Furthermore, when an insulation film such as an about 50 nm to 500 nm thick silicon oxide film, etc., is formed on the surface of the donor substrate in advance and hydrogen ions or hydrogen molecule ions are implanted therethrough, effect of suppressing channeling of implantation ions can be obtained.

Then, a surface of the donor substrate and/or a surface of the handle substrate are subjected to an activation treatment. Methods of the surface activation treatment include an ozone treatment, an HF treatment, a plasma treatment, etc. When the treatment is conducted with ozone, a substrate surface is ozone-treated by placing a donor substrate and/or a handle substrate, after subjected to cleaning such as RCA cleaning, etc., in a chamber in which atmospheric air, and performing UV lamp irradiation to convert oxygen in the atmosphere to ozone. When the treatment is conducted with HF, a donor substrate and/or a handle substrate after subjected to cleaning, such as RCA cleaning, etc., are immersed in a 20% HF solution so that an oxide on a surface is etched. When the treatment is conducted with plasma, a substrate surface is plasma-treated by placing a donor substrate and/or a handle substrate after subjected to cleaning such as RCA cleaning, etc., in a vacuum chamber, introducing a gas for plasma reaction therein at a reduced pressure, and exposing the substrate to approximately 100 W of high-frequency plasma for approximately 5 seconds to 10 seconds. For the gas for plasma reaction when the donor substrate is treated, an oxygen gas plasma may be used in a case of oxidizing the surface, while a hydrogen gas, an argon gas, a gas mixture of hydrogen and argon, or a gas mixture of hydrogen and helium may be used in a case of not oxidizing the surface. When the handle substrate is treated, any gas may be used. Treating with plasma oxidizes and removes organic materials on the surface of the donor substrate and/or the handle substrate, so that OH radicals on the surface are further increased to activate the surface. Preferably, the surface activation treatment is applied to both the ion-implanted surface of the donor substrate and a surface of the handle substrate to be bonded. However, only one of the surfaces may be treated. The ozone treatment, the HF treatment, the plasma treatment, etc., may be used alone or in combination. A surface of the donor substrate to be subjected to the surface activation treatment is preferably an ion-implanted surface.

Then, these substrates are bonded to each other, so that this surface of the donor substrate and the ozone and/or HF and/or plasma treated surface of the handle substrate form bonded faces.

After that, preferably, the bonded substrates are subjected to a heat treatment at temperature between 150° C. and 350° C. to provide an assembly. The reason why the heat treatment is preferable is that a bonding strength at the bonded faces is increased thereby. The reason why the temperature is between 150° C. and 350° C. is that a bonding strength is not increased at temperature less than 150° C., and the bonded substrates may be subjected to breakage at temperature exceeding 350° C. As a result of the inventor's consideration through experiments, it is found that a suitable temperature when the handle substrate is made of aluminum oxide is from 150° C. to 300° C., and a suitable temperature when the handle substrate is made of sapphire is from 150° C. to 175° C. The temperature range above differs according to a substrate. Although somewhat depending on temperature, the heat treatment time is preferably 5 hours to 10 hours.

According to an production method of the present invention, bonded substrates after subjected to a heat treatment are cooled to temperature not greater than room temperature (25° C.). The FIGURE shows a relationship between bonded substrates 1 and a cooling means 20. Cooling to temperature not greater than room temperature can be performed by placing the bonded substrates 1 on a aluminum block 30 in an insulating container 40, and cooling the periphery of the block 30 with dry ice 50. This method provides the advantages that the aluminum block 30 is excellent in thermal conductivity so that an intended object can be cooled quickly, and dry ice 50 is available at low cost. Additionally, a method for cooling to temperature not greater than room temperature may include cooling with liquid nitrogen, cooling by jet blowing of air that is cooled to a desired temperature, etc. Furthermore, the periphery of the aluminum block 30 is desirably thermally insulated with a heat insulating material 31 so as to enhance cooling efficiency. At this time, cooling is effected by heat transfer from the bottom surface of the aluminum block 30. Forming the bottom of the aforementioned block 30 to have a shape of a cooling fin is more acceptable in view of promoting cooling.

When the bonded substrates 1 and the aluminum block 30 reach a condition of thermal equilibrium, donor thin film delamination is performed at an ion-implanted interface 5. This delamination can be performed by pulling a donor substrate 3 and a handle substrate in opposite directions (vertically opposite or horizontally opposite with respect to substrate surfaces) while jet-blowing a fluid such as a gas or a liquid, to a bonding interface at a pressure, for example, between 1 MPa to 5 MPa, which causes no breakage in a wafer. The wafer may not be delaminated at a pressure less than 1 MPa. Pulling in opposite directions can be performed, for example, using a suction means 10 such as a vacuum chuck to suck a part of a surface of the donor substrate near a portion thereof to be subjected to blowing of a gas, a liquid, etc., while holding the handle substrate 7 of the bonded substrates using a means for holding by suction (not shown) such as a vacuum chuck, an electrostatic chuck, a suction device, etc., and blowing fluid jet 15 of gas, liquid, etc., of a pressure between 1 MPa and 5 MPa to the bonding interface near the vacuum chuck among a bonding interface between the silicon substrate and the sapphire substrate while pulling upward the donor substrate 3. The temperature of gas or liquid to be jet-blown is desirably pre-adjusted to a substrate cooling temperature of from −50° C. to room temperature. The temperature of the substrates to be delaminated is preferably not more than −50° C. At temperature greater than −50° C., either or both of the donor substrate 3 and the handle substrate 7 crack, or the ion-implanted interface 5 is in a condition in which no delamination progresses. The lower limit of the temperature may be, for example, −80° C., to prevent cooling energy from being unduly increased to cause increase in cost.

EXAMPLE 1

As a donor substrate, a silicon substrate with a diameter of 150 mm (thickness: 625 micrometers) in which an oxide film had grown to 200 nm was provided, and hydrogen ions were implanted thereto at 55 keV and a dosage of $2\times10^{16}/cm^2$. Furthermore, a sapphire substrate with a diameter of 150 mm (thickness; 700 micrometers, manufactured by KYOCERA) to be used as a handle substrate 7 was provided. The ion implanted surface of the silicon substrate and a surface of the sapphire substrate were subjected to an ozone treatment, and were bonded to each other. Then, a heat treatment was applied to the bonded substrates at 160° C. for 10 hours. An aluminum block (had a diameter of 160 mm, and a thickness of 100 mm. In an area of the block on which the substrate was placed, a groove having a width of 1 mm and a depth of 1 mm is concentrically formed along each of circles having a diameter of 140 mm and a diameter 50 mm. These grooves are connected through a cross-shaped groove having the same dimensions as those of these grooves. A hole of a diameter of 1 mm is provided at the intersection point, i.e., the center, of the cross, and a pipe to a vacuum pump is connected to the hole. The aluminum block could yield a vacuum chuck function over an area on which a substrate with a diameter of 150 mm was placed. A heat insulating material made of styrene having a heat insulation property was provided entirely about the periphery of this block. This block was placed in a heat insulating container made of styrene, having an inner diameter of 250 mm (thickness: 150 mm). Five blocks of 50 mm×50 mm×50 mm, made of styrene, were adhered in advance to the bottom surface of the aluminum block. Dry ice (sublimation point: −79° C.) was placed in the heat insulating container, and the aluminum block was placed thereon. After being left to stand for a while, the temperature at the block surface was measured to be −50° C. The aforementioned assembly was placed on this aluminum block, and held as they were, until the surface temperature fell as low as the block surface temperature and the bonded substrates reached a condition of thermal equilibrium. After that, while holding by suction the handle substrate of the assembly by means of a lower vacuum chuck device (not shown) that had been mounted to the aluminum block, an end of the donor substrate opposite thereto was sucked by a small upper vacuum chuck. Air having a pressure of 1.1 MPa was blown toward a part of a bonding interface near the upper vacuum chuck between the silicon substrate and the sapphire substrate, while pulling upward the upper vacuum chuck with a force of 2 N. As a result, it was found that a silicon film having a thickness about 400 nanometers was uniformly and evenly transferred on the sapphire substrate.

COMPARATIVE EXAMPLE 1

As a semiconductor substrate, a silicon substrate with a diameter of 150 mm (thickness: 625 micrometers) in which an oxide film had grown to 200 nm was provided, and hydrogen ions were implanted thereto at 55 keV and a dosage of $2\times10^{16}/cm^2$. Furthermore, a sapphire substrate with a diameter of 150 mm (thickness: 700 micrometers) to be used as a handle substrate was provided. The ion implanted surface of the silicon substrate and a surface of the sapphire substrate were subjected to an plasma treatment, and were bonded to each other. Then, a heat treatment was applied to the bonded substrates at 160° C. for 10 hours. A block made of aluminum which had a size (diameter: 160 mm, thickness: 100 mm) on which a substrate with a diameter of 150 mm could be placed, and which could yield a vacuum chuck function, was provided. This block was placed in a heat insulating container made of styrene and having an inner diameter of 250 mm (thickness: 150 mm). Five blocks of 50 mm×50 mm×50 mm, made of styrene, were adhered in advance to the bottom surface of the aluminum block. Dry ice (sublimation point: −79° C.) was placed in the heat insulating container, and the aluminum block was placed thereon. After being left to stand for a while, the temperature at the block surface was measured to be −45° C. The aforementioned assembly was placed on this aluminum block and was held as it was, until the surface temperature fell as low as the block surface temperature and the bonded substrates reached a condition of thermal equilibrium. After that, while holding by suction the handle substrate of the assembly by means of a lower vacuum chuck device that had been mounted to the aluminum block, an end of the donor substrate opposite thereto was sucked by a small upper vacuum chuck. Air having a pressure of 1.1 MPa was blown toward a part of a bonding interface near the upper vacuum chuck between the silicon substrate and the sapphire substrate, while pulling upward the upper vacuum chuck with a force of 2 N. As a result, the silicon substrate cracked in the course of heating, and a silicon film was not uniformly transferred on the sapphire substrate.

The invention claimed is:

1. A method for producing a bonded wafer, comprising at least the steps of:
   implanting ions into a donor substrate from a surface of the donor substrate to form an ion-implanted interface;
   bonding a handle substrate with a thermal expansion coefficient higher than that of the donor substrate onto the ion-implanted surface of the donor substrate to provide bonded substrates;
   subjecting the bonded substrates to a heat treatment to obtain an assembly; and
   delaminating the donor substrate of the assembly at the ion-implanted interface wherein the assembly has been cooled to a temperature not greater than room temperature, so that a donor film is transferred onto the handle substrate, and
   wherein the cooling of the assembly to a temperature not greater than room temperature in the delaminating step is performed by placing the assembly on an aluminum block and cooling a periphery of the aluminum block with dry ice.

2. The method for producing a bonded wafer according to claim 1, wherein the temperature not greater than room temperature in the step of delamination is not more than −50° C.

3. The method for producing a bonded wafer according to claim 1, wherein
   a material of the donor substrate is silicon, and
   a material of the handle substrate is any one selected from aluminum oxide, aluminum nitride, silicon carbide, silicon nitride, sialon, and gallium nitride.

4. The method for producing a bonded wafer according to claim 1, wherein the step of delaminating comprises delamination by pulling the donor substrate and the handle substrate in opposite directions while jet-blowing a fluid to a bonding interface at a pressure not less than 1 MPa.

5. The method for producing a bonded wafer according to claim 2, wherein
   a material of the donor substrate is silicon, and a material of the handle substrate is any one selected from aluminum oxide, aluminum nitride, silicon carbide, silicon nitride, sialon, and gallium nitride.

6. The method for producing a bonded wafer according to claim 2, wherein the step of delaminating comprises delamination by pulling the donor substrate and the handle substrate in opposite directions while jet-blowing a fluid such as a gas, or a liquid, to a bonding interface at a pressure not less than 1 MPa.

* * * * *